United States Patent
Wright et al.

(10) Patent No.: US 9,832,868 B1
(45) Date of Patent: Nov. 28, 2017

(54) ELECTRONIC DEVICE DISPLAY VIAS

(71) Applicant: Apple Inc., Cupertino, CA (US)

(72) Inventors: Derek W. Wright, San Francisco, CA (US); James E. Pedder, Cupertino, CA (US); Soyoung Kim, San Jose, CA (US); Stephen R. McClure, San Francisco, CA (US); Elmar Gehlen, Cupertino, CA (US); Sudirukkuge T. Jinasundera, San Jose, CA (US); Tingjun Xu, San Jose, CA (US); Michael Vosgueritchian, Cupertino, CA (US); Xiaonan Wen, San Jose, CA (US); Wei Lin, Santa Clara, CA (US); Prithu Sharma, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/071,041

(22) Filed: Mar. 15, 2016

Related U.S. Application Data

(60) Provisional application No. 62/210,275, filed on Aug. 26, 2015.

(51) Int. Cl.
*H05K 1/09* (2006.01)
*H05K 1/03* (2006.01)
(Continued)

(52) U.S. Cl.
CPC .......... *H05K 1/0306* (2013.01); *C25D 7/123* (2013.01); *G06F 3/041* (2013.01); *H05K 1/09* (2013.01); *H05K 1/115* (2013.01); *H05K 3/0044* (2013.01); *H05K 3/4038* (2013.01); *G06F 2203/04103* (2013.01)

(58) Field of Classification Search
CPC ............ H01L 51/5237; H01L 51/5246; H01L 25/167; H01L 25/18; H01L 27/3262; H01L 51/003; H01L 2227/323; H01L 2227/326; H01L 27/1218; H01L 27/3276; H01L 2251/5338; H01L 27/1259; H01L 51/0097; H01L 51/00; H01L 51/56; H01L 25/16; H01L 51/52; H01L 27/32; H01L 51/5281;
(Continued)

(56) References Cited

U.S. PATENT DOCUMENTS 6,690,032 B1 * 2/2004 Umetsu ................ G02F 1/1345
257/621
8,345,177 B2 1/2013 Chang et al.
(Continued)

*Primary Examiner* — Michael F McAllister
(74) *Attorney, Agent, or Firm* — Treyz Law Group, P.C.; G. Victor Treyz; David K. Cole

(57) ABSTRACT

An electronic device may have layers of glass for forming components such as a display. A display cover glass layer may overlap an array of pixels. A touch sensor may be formed under the display cover glass layer. Conductive structures such as transparent conductive electrodes or other conductive layers of material may be formed on the outer surface of the display cover glass layer. The electrodes on the outer surface of the display cover glass layer may be coupled to metal contacts and other circuitry on the inner surface of the display cover glass layer using conductive vias. Vias may be provided with barrier layers, opaque coatings, tapers, and other structures and may be formed using techniques that enhance compatibility with chemical strengthening processes.

20 Claims, 13 Drawing Sheets

(51) Int. Cl.
*H05K 1/11* (2006.01)
*H05K 3/00* (2006.01)
*H05K 3/40* (2006.01)
*G06F 3/041* (2006.01)
*C25D 7/12* (2006.01)

(58) Field of Classification Search
CPC .......... G06F 3/041; H03K 2217/96031; H05B 33/0896
See application file for complete search history.

(56) References Cited

U.S. PATENT DOCUMENTS

| | | | | |
|---|---|---|---|---|
| 8,584,354 B2* | 11/2013 | Cornejo | ................. | C03C 15/00 29/825 |
| 9,105,615 B1 | 8/2015 | Ghali | | |
| 9,226,347 B2 | 12/2015 | Weber et al. | | |
| 2007/0166991 A1* | 7/2007 | Sinha | ................. | H01L 21/76898 438/597 |
| 2010/0133661 A1* | 6/2010 | Sinha | ................. | H01L 21/76898 257/621 |
| 2012/0235969 A1* | 9/2012 | Burns | ................. | B81C 1/00095 345/211 |
| 2013/0107476 A1* | 5/2013 | Wright | ................. | G09G 3/3208 361/752 |
| 2013/0293482 A1 | 11/2013 | Burns et al. | | |
| 2013/0342099 A1* | 12/2013 | Weber | ................. | H05B 33/02 313/498 |
| 2014/0132856 A1* | 5/2014 | Hung | ................. | C03C 25/10 349/12 |
| 2014/0144681 A1 | 5/2014 | Pushparaj et al. | | |
| 2014/0308525 A1* | 10/2014 | Hochrein | ................. | C03C 3/093 428/410 |
| 2015/0166395 A1* | 6/2015 | Marjanovic | ........ | B23K 26/0057 428/131 |

* cited by examiner

ELECTRONIC DEVICE DISPLAY VIAS

This application claims the benefit of provisional patent application No. 62/210,275, filed Aug. 26, 2015, which is hereby incorporated by reference herein in its entirety.

BACKGROUND

This relates generally to electronic devices, and, more particularly, to electronic devices with layers of transparent material such as display layers.

Electronic devices such as laptop computers, cellular telephones, and other equipment are often provided with displays. Displays contain arrays of pixels that present images to a user. Displays contain transparent layers of material such as glass layers. Some displays include touch sensors.

It may be desirable to interconnect circuitry on one side of a glass layer in an electronic device to circuitry on another side of a glass layer, but doing so poses challenges. If care is not taken, signal interconnect paths between opposing sides of a glass layer will not be reliable, will create undesired visual artifacts, or will consume more space within an electronic device than desired.

It would therefore be desirable to be able to provide improved ways in which to interconnect circuitry on opposing sides of a display layer or other layer in an electronic device.

SUMMARY

An electronic device may have layers of material such as one or more layers of glass. Glass layers may be used to form layers in a display such as substrate layers and a display cover glass layer.

A display cover glass layer may overlap a liquid crystal display module, an organic light-emitting diode display module, or other display structures. A touch sensor may be formed under the display cover glass layer.

Conductive structures such as transparent conductive electrodes or other conductive layers of material may be formed on the outer surface of the display cover glass layer. The conductive structures may be used in forming touch sensor components or other circuitry. The circuitry on the outer surface of the display cover glass layer may be coupled to metal contacts and other circuitry on the inner surface of the display cover glass layer using conductive vias.

Vias through the display cover glass layer or other glass display layers may be provided with barrier layers, opaque coatings, tapers, and other structures and may be formed using low temperature processes or other techniques that enhance compatibility with chemical glass strengthening processes.

Further features of the invention, its nature and various advantages will be more apparent from the accompanying drawings and the following detailed description.

DETAILED DESCRIPTION

Conductive vias may be used to interconnect circuitry on opposing sides of a layer of material. The material through which the conductive vias are formed may be polymer such as thermoset polymer, glass, ceramic, or other suitable materials and may be transparent, translucent, or opaque. Arrangements in which the layer of material through which the conductive vias are formed is a clear glass layer for a display may sometimes be described herein as an example.

Figure 1:
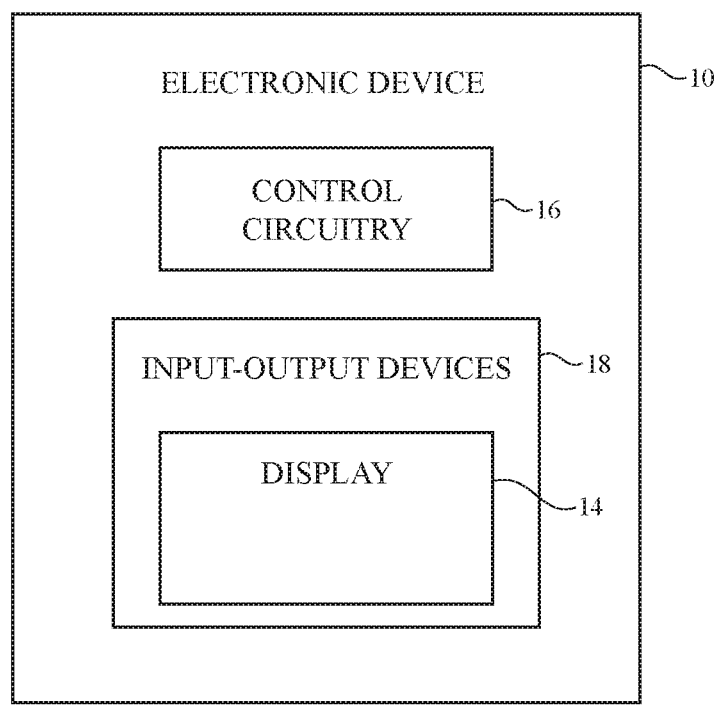
FIG. 1 is a schematic diagram of an illustrative electronic device having a display in accordance with an embodiment.

An illustrative electronic device of the type that may be provided with a display having conductive vias is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 18 may be used to allow data to be supplied to device 10 and to allow data to be provided from device 10 to external devices. Input-output devices 18 may include buttons, joysticks, scrolling wheels, touch pads, key pads, keyboards, microphones, speakers, tone generators, vibrators, cameras, light-emitting diodes and other status indicators, data ports, etc. Input-output devices 18 may include sensors such as an ambient light sensor, a capacitive proximity sensor, a light-based proximity sensor, a magnetic sensor, an accelerometer, a force sensor, a touch sensor, a temperature sensor, a pressure sensor, a compass, a microphone or other sound sensor, or other sensors. A user can control the operation of device 10 by supplying commands through input-output devices 18 and may receive status information and other output from device 10 using the output resources of input-output devices 18.

Input-output devices 18 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. If desired, electrodes, ground plane structures, or structures for other components may be incorporated into display 14. Transparent electrodes such as capacitive touch sensor electrodes may be formed on the upper and/or lower surfaces of one or more layers in display 14. Display 14 may be an organic light-emitting diode display or other light-emitting diode display, a liquid crystal display, a plasma display, an electrowetting display, an electrophoretic display, or other suitable display.

Figure 2:
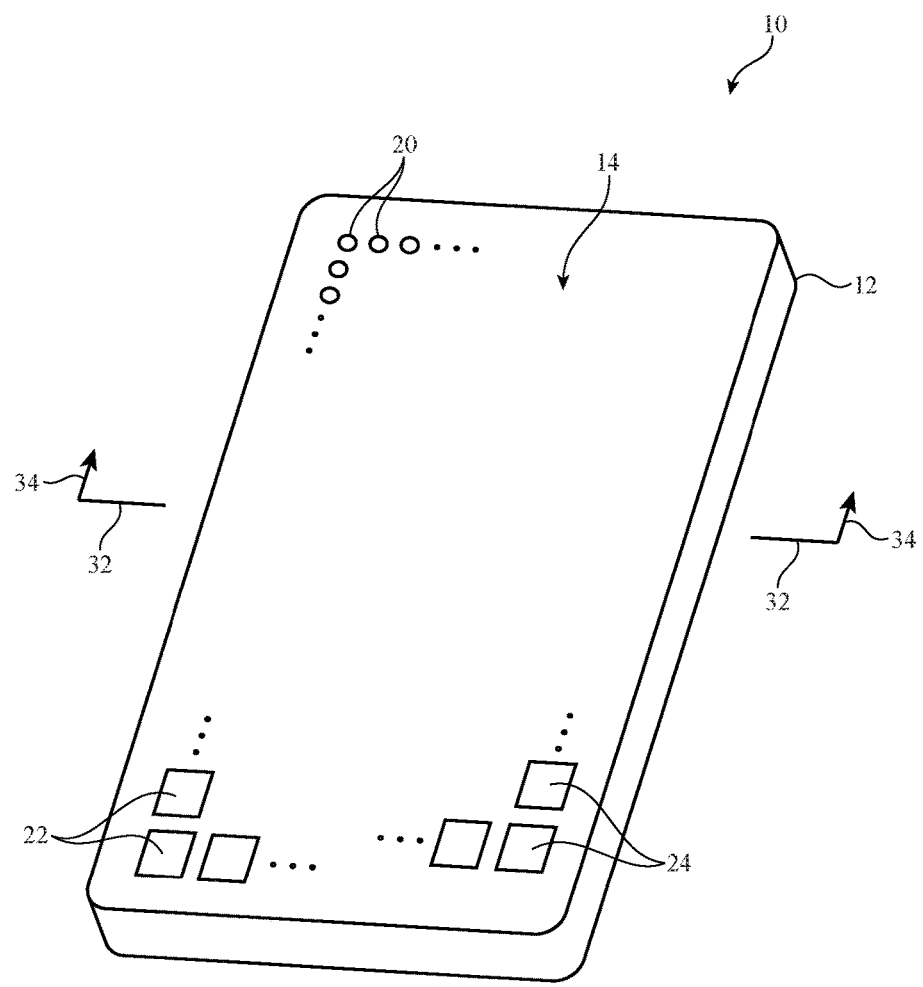
FIG. 2 is a perspective view of an illustrative device having with a display in accordance with an embodiment.

As shown in FIG. 2, display 14 may be mounted in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have a single body (e.g., when device 10 is a cellular telephone, tablet computer, wristwatch device, etc.) or may have multiple body portions that are coupled by a hinge (e.g., in a laptop computer). Housing 12 may also have other shapes, if desired.

Display 14 may include one or more overlapping arrays of components. For example, display 14 may include an array of pixels such as pixels 20. Pixels 20 may be organized in rows and columns and may be used in displaying images for a user of device 10. Display 14 may also include one or more array of transparent electrodes such as electrodes 22 and 24 (e.g., arrays of capacitive touch sensor electrodes 22 for gathering touch input from a user, etc.). Each of these arrays may overlap over some or all of the area encompassed by display 14.

Figure 3:
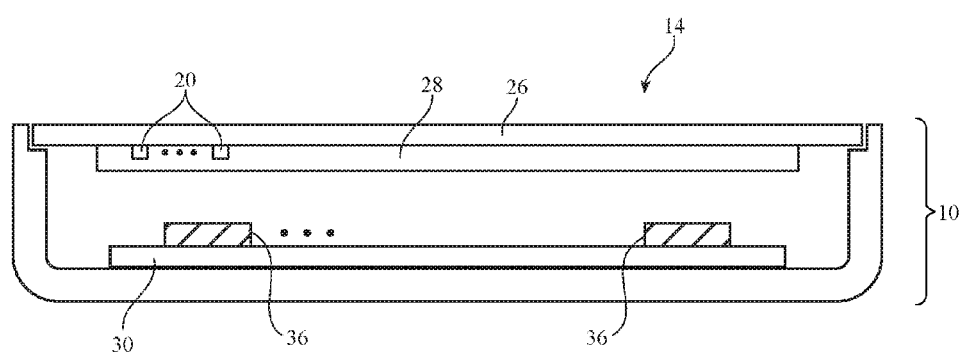
FIG. 3 is a cross-sectional side view of an illustrative electronic device having a display in accordance with an embodiment.

FIG. 3 is a cross-sectional side view of electronic device 10 of FIG. 2 taken along line 32 and viewed in direction 34.

As shown in FIG. 3, device 10 may include electrical components 36. Electrical components 36 may include integrated circuits, sensors, connectors, batteries, audio circuits, speakers, microphones, and other input-output devices and control circuitry. Electrical components 36 may be mounted on one or more substrates such as substrate 30. Substrates such as substrate 30 may be formed from plastic, glass, ceramic, other dielectric materials, printed circuits (e.g., rigid printed circuits formed from fiberglass-filled epoxy or other rigid printed circuit material and/or flexible printed circuits formed from flexible layers of polyimide or sheets of other polymer substrate materials), or other substrate material.

Display 14 may have an outermost layer such as display cover layer 26. Layer 26 may be formed from a transparent material that helps protect display 14 such as a layer of transparent plastic, clear glass, sapphire, or other protective display layer. Configurations in which display cover layer 26 is formed from glass are described herein as an example, so layer 26 may sometimes be referred to as a display cover glass layer or display cover glass.

Display 14 may have a display module such as display module 28. Display module 28 may be a liquid crystal display module or organic light-emitting diode display module (as examples). Display module 28 (sometimes referred to as display structures or display layers) may contain pixels 20. Pixels 20 may be arranged in a rectangular array of rows and columns or other suitable layouts to display images for a user of device 10.

Touch sensor structures for display 14 may be embedded within display module 28, may be formed on the underside of display cover glass 26, and/or may be formed on a touch sensor substrate that is interposed between display cover glass 26 and display module 28 (as examples). The touch sensor structures may be formed from an array of electrodes such as electrodes 22 of FIG. 2. Electrodes 24 of FIG. 2 (e.g., touch sensor electrodes) may be formed on display cover glass 26 (e.g., on the outer surface of display cover glass 26). If desired, electrodes 22 and/or electrodes 24 may be omitted.

Circuit structures in device 10 that overlap pixels 20 such as electrodes 22 and electrodes 24 may be formed from transparent conductive materials to avoid blocking images that are being displayed by pixels 20. For example, electrodes 22 and electrodes 24 may be formed using metal layers that are sufficiently thin to be transparent and/or transparent conductive oxide layers such as layers of indium tin oxide or zinc oxide.

Transparent conductive structures on the outer surface of display cover glass 26 such as conductive structures (electrodes) 24 may be interconnected with circuitry below display cover glass 26 in the interior of device 10 using metal-filled vias or other filled or non-filled conductive vias that pass through display cover glass 26.

Figure 4:
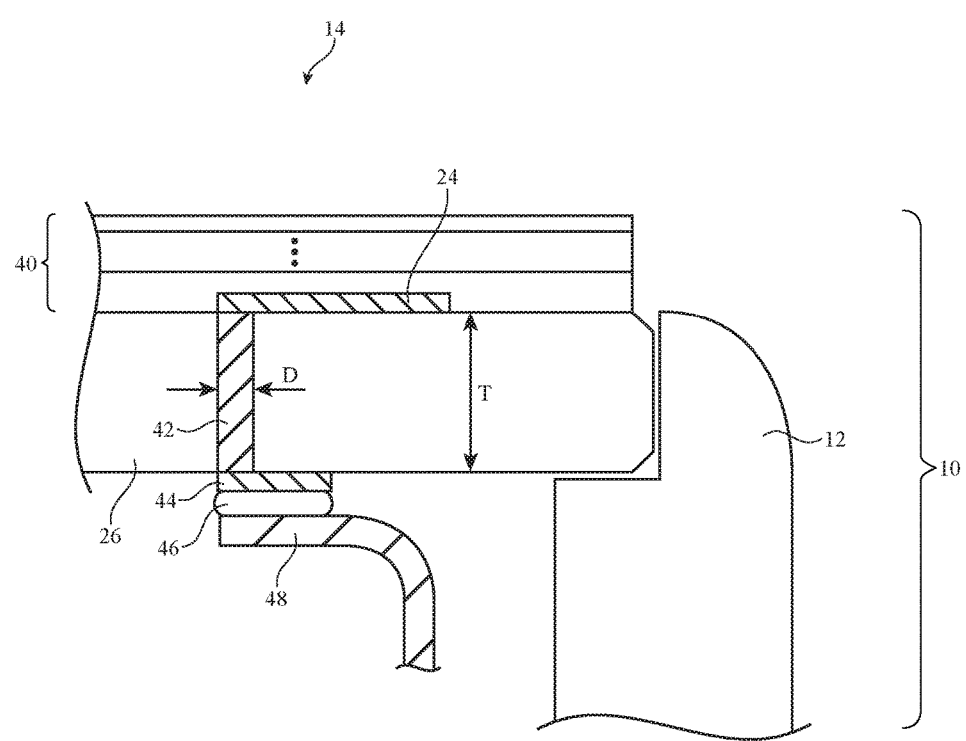
FIG. 4 is a cross-sectional side view of a portion of an electronic device having a display layer such as a display cover glass layer with a via in accordance with an embodiment.

A cross-sectional side view of a portion of device 10 showing how vias may pass through display cover glass 26 is shown in FIG. 4. As shown in FIG. 4, device 10 may include display cover glass 26 mounted to housing 12. Conductive structures 24 (e.g., one or more transparent conducting oxide layers that have been patterned to form electrodes, etc.) may be formed on the outer surface of display cover glass 26. One or more layers of material such as layer(s) 40 may cover structures 24 (e.g., layers of metal, conductive oxide, transparent polymer layers, inorganic dielectric layers such as clear layers of oxide and other material, antiscratch layers, antireflection layers, and/or other layers of material).

Metal pads or other conductive contact structures may, if desired, be formed on the opposing inner surface of display cover glass 26 from structures 24 (see, e.g., metal contact 44). Conductive vias such as conductive via 42 may pass through display cover glass 26 and may electrically couple structures such as structure 24 to structures such as contact 44. On the front surface of cover glass layer 26, structures 24 may overlap and contact the upper surface of via 42 and on the lower surface of cover glass layer 26, contacts 44 may overlap and contact the opposing lower surface of via 42.

Inside device 10, electrical components such as integrated circuits, signal path structures, or other electrical components may be coupled to conductive vias such as conductive via 42 (and, if desired, may be coupled to other structures such as ink or other opaque masking material, glass 26, etc.). For example, a flexible printed circuit, integrated circuit, or other electrical component 48 may have signal paths formed from metal traces. The metal traces may be coupled to via 42 through contact 44 using conductive material 46 (e.g., solder, conductive adhesive such as anisotropic conductive film or isotropic conductive adhesive, welds, or other conductive coupling structures). Component 48 may be a flexible printed circuit that contains multiple conductive lines coupled to respective contacts 44 and that route signals between these contacts and control circuitry 16 and/or may include one or more integrated circuits in control circuitry 16.

If desired, conductive material 46 may be coupled directly between an exposed portion of conductive via 42 and metal traces in component 48 without using intervening metal structures such as contacts 44. Moreover, conductive lines, transparent conductive structures other than structure 24 of FIG. 4, or other circuitry on the upper surface of display cover glass 26 may be interconnected to circuitry on the lower surface of display cover glass 26 using conductive vias 42. The use of conductive via 42 of FIG. 4 to electrically short conductive structure 24 to contact 44 is merely illustrative.

Conductive vias such as via 42 may have any suitable size and shape. With one illustrative configuration, conductive via 42 may have a diameter of about 50 µm, 30-100 µm, more than 10 µm, more than 30 µm, more than 75 µm, less than 400 µm, or less than 150 µm. Conductive via 42 may have a height equal to the thickness T of glass layer 26. The thickness T of layer 26 (and therefore the height of conductive via 42) may be 500 µm, 200-1000 µm, more than 50 µm, more than 250 µm, more than, 400 µm, less than 700 µm, or other suitable thickness. Structures such as structures 24 and/or contacts 44 may be formed from one or more sublayers (e.g., using a single-layer metal deposition process or a multi-layer metallization technique).

To ensure that display cover glass layer 26 is sufficiently robust to resist damage during handling of device 10 by a user, it may be desirable to chemically strengthen display cover glass layer 26. Any suitable transparent material may be used in forming a display cover layer for display 14. With one illustrative configuration, display 14 is covered with a layer of glass such as aluminosilicate glass. An aluminosilicate glass layer may be strengthened using an ion exchange process in which the glass layer is immersed in a molten potassium salt bath (e.g., a bath maintained at a temperature of about 400° C.). During this chemical treatment, potassium ions from the bath diffuse into the glass and replace sodium ions in the glass, thereby creating compressive stress in the surface of the glass that helps the glass to resist cracking.

In creating conductive via 42, via holes may be formed within glass 26 and filled with metals or other conductive materials in a way that is compatible with the use of glass strengthening techniques such as ion exchange processes. Compatible processes may involve low-temperature processes that are used after ion exchange treatment of glass 26 (so as to prevent damage to the heat treated portions of glass 26) and/or low-temperature or high-temperature processes that are performed prior to strengthening.

Figure 5:
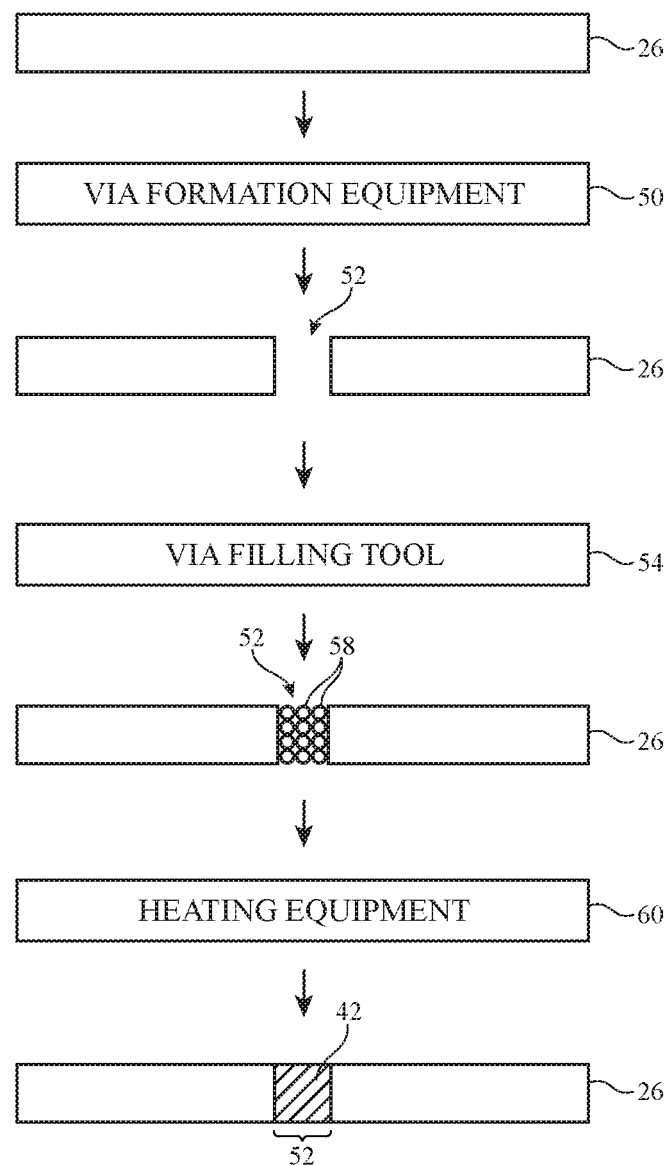
FIGS. 5, 6, and 7 are diagrams showing illustrative equipment and operations involved in forming vias in layers of material such as glass display layers in accordance with an embodiment.

FIG. 5 shows illustrative equipment and operations associated with creating conductive vias such as conductive via 42 of FIG. 4. As shown in FIG. 5, via formation equipment 50 may be used to create via hole 52 in glass layer 26. Via formation equipment 50 may include laser-based via formation equipment, equipment that uses both laser light exposure and chemical etching to form vias, photolithographic patterning tools (e.g., deep reactive ion etching or other etching tools for etching via holes while portions of glass layer 26 are covered with a protective etch mask), machining tools (e.g., drills, milling machines, and other equipment for mechanically forming via holes), water-jet processing equipment, or other drilling tools. If desired, glass layer 26 may be polished (e.g., using chemical mechanical polishing techniques or other polishing techniques to help planarize glass 26 and the structures on glass 26). Planarization may be performed before etching, after etching, before via filling, and/or after via filling, etc.

After forming via hole 52, via filling tool 54 may be used to deposit material 58 in via hole 52 of glass layer 26. Material 58 may be conductive as it is deposited (e.g., material 58 may be metal) or may be a material that becomes conductive after heating with heating equipment 60. For example, material 58 may be a material such as a liquid polymer that contains conductive particles such as metal particles or conductive metal oxide particles such as indium tin oxide particles. When the polymer cures (at room temperature, upon exposure to ultraviolet light, upon heating with heating equipment 60, etc.), the conductive particles provide material 58 with sufficient conductivity to serve as conductive via 42. As another example, material 58 may be formed from a mixture of particles such as a mixture of glass frit (glass particles) and metal particles that becomes conductive only after sintering at an elevated temperature (e.g., 600° C.) with heating equipment 60. To reduce the processing temperature of this type of process, the glass frit or other materials that are combined with the conductive particles may be configured to exhibit a low melting temperature. If desired, other techniques may also be used in forming conductive material in via hole 52 (e.g., metal may be deposited using physical vapor deposition, electroless deposition or other electrochemical deposition, chemical vapor deposition, etc.).

Figure 6:
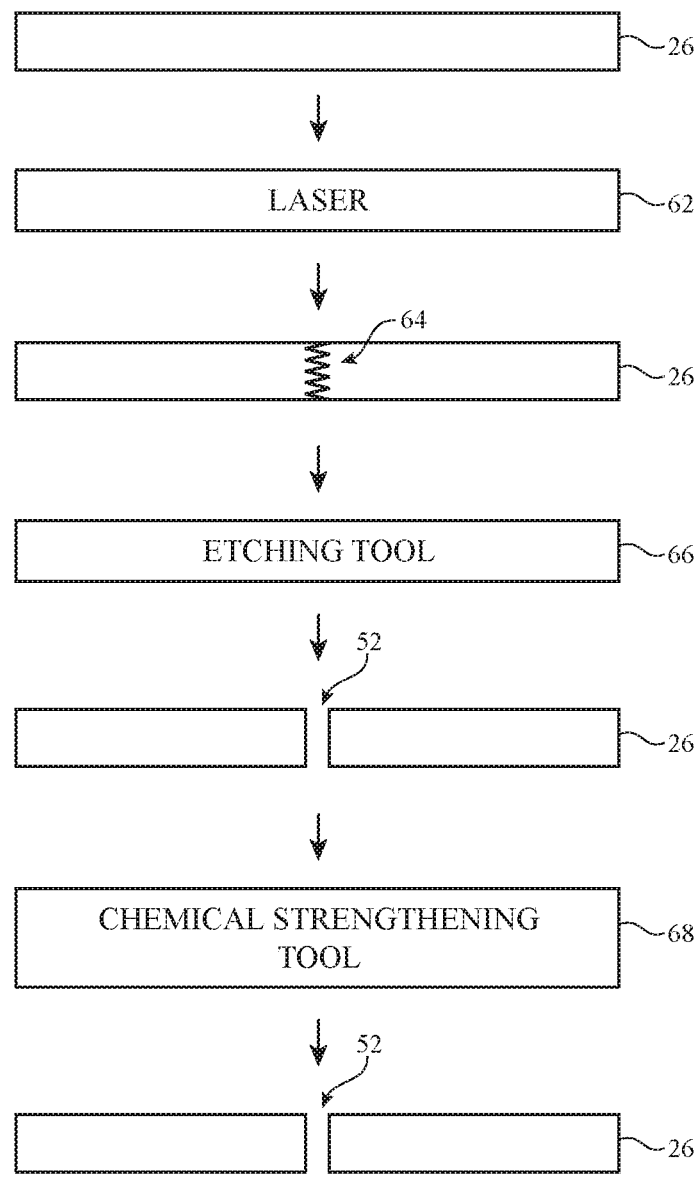

FIG. 6 is a diagram showing illustrative equipment and operations involved in forming via holes such as via hole 52 in glass layer 26 using a laser-based process. As shown in FIG. 6, laser 62 may apply laser light to glass layer 26 to create modified via hole region 64 (e.g., a region in which the bulk properties of glass layer 26 have been chemically and/or physically modified to make the glass more susceptible to etching). Laser 62 may be a pulsed laser or a continuous wave laser and may operate at infrared wavelengths, ultraviolet wavelengths, or visible wavelengths.

Modified via hole region 64 is more susceptible to etching (e.g., wet etching) than unmodified portions of glass layer 26, so the material of region 64 is preferentially etched when glass layer 26 is exposed to etchant in etching tool 66. The etching process therefore forms via hole 52.

Chemical strengthening tool 68 (e.g., a tool that exposes glass layer 26 to a molten potassium salt to perform an ion exchange process) may then be used to strengthen layer 26 (e.g., prior to filling hole 52 with conductive material as shown in FIG. 5). In this type of arrangement, it may be desirable to fill via 52 using a relatively low temperature process (e.g., a process below 200° C., below 100° C., or below other suitable temperatures) to avoid compromising the strength of the treated glass. An example of a low-temperature conductive material deposition process that may be used in filling via hole 52 is a deposition process in which the conductive material for filing via hole 52 is a liquid polymer with conductive particles (e.g., a conductive ink containing a liquid polymer and particles of transparent conductive oxide, metal particles, or other conductive particles). Low temperature plasma enhanced chemical vapor deposition techniques, physical vapor deposition techniques such sputtering or evaporation, electrochemical deposition techniques, and/or other conductive material deposition and patterning techniques may also be used in depositing some or all of the conductive material of conductive vias 42.

Figure 7:
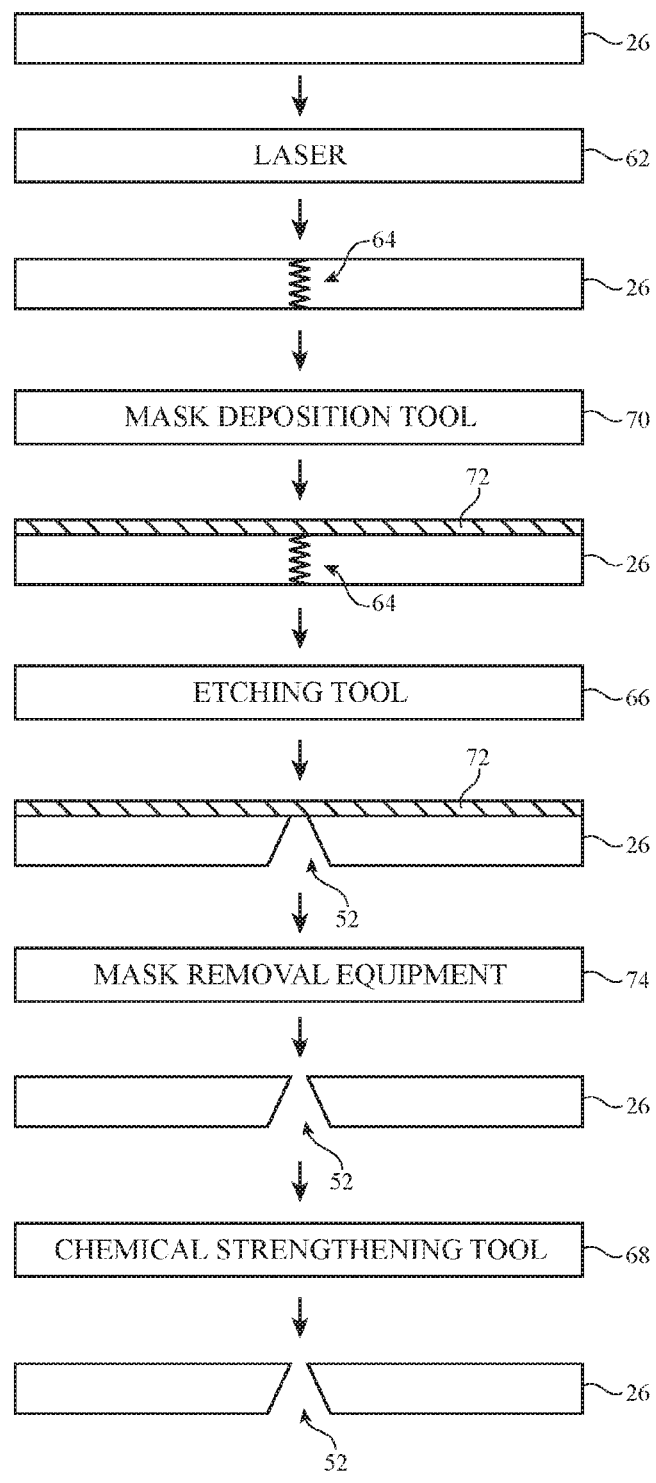

It may be desirable to control the profile of via hole 52 (e.g., to form vertical sidewalls, tapered sidewalls, flared sidewalls, etc.). An illustrative arrangement for forming via holes with tapered sidewalls is shown in FIG. 7. As shown in FIG. 7, modified via hole region 64 may be formed by laser 62. Before etching away region 64, mask deposition tool 70 may apply a mask such as mask layer 72 to the upper surface of layer 26. Mask layer 72 may be, for example, a layer of polymer. Mask deposition tool 70 may include equipment for depositing layer 72 using spinning, spraying, dripping, slit coating, or other suitable coating techniques. When glass layer 26 is exposed to etchant using tool 66, modified via hole region 64 will be etched away from the lower surface of glass layer 26, resulting in a tapered via hole shape for via hole 52 (i.e., a shape in which the diameter of hole 52 is the largest on the lower surface of glass layer 26 where glass layer 26 was uncovered by masking layer 72 and in which the diameter of hole 52 is smallest on the upper surface of glass layer 26 where mask 72 protects glass 26 from over-etching). Mask removal equipment 74 may remove mask 72 following etching (or mask 72 may be retained for use during subsequent processing steps). After removing mask 72, chemical strengthening tool 68 may be used to strengthen glass layer 26.

Figure 8:
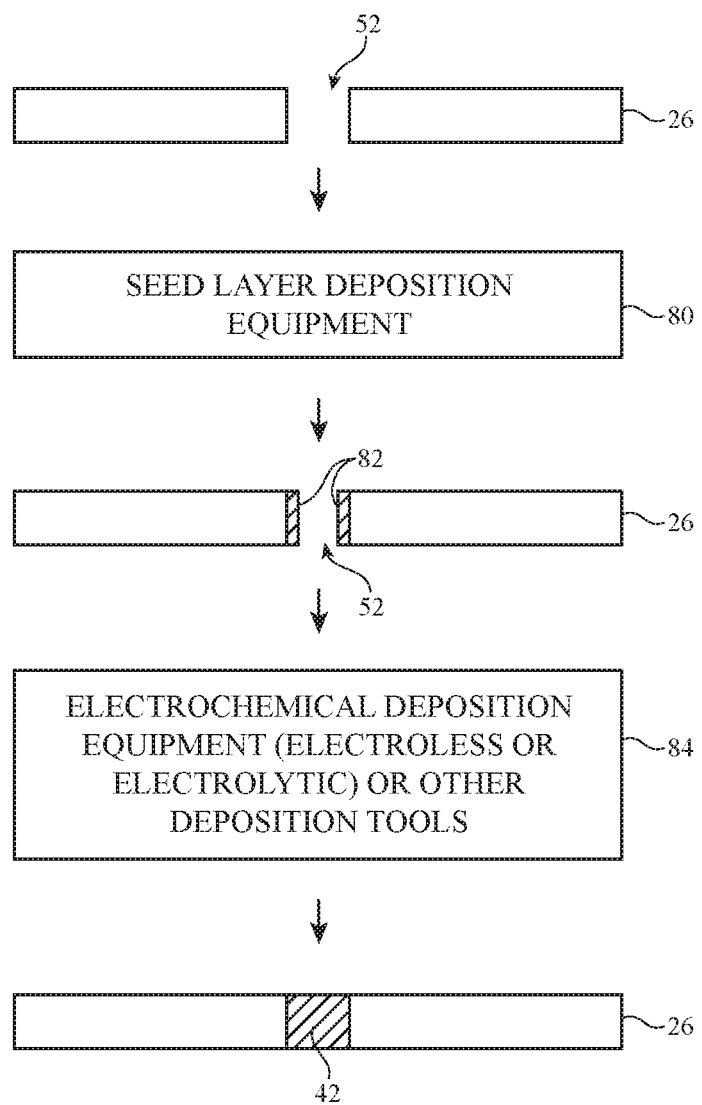
FIG. 8 is a diagram showing illustrative equipment and operations involved in filling vias with conductive material in accordance with an embodiment.

If desired, electrochemical deposition techniques may be used in depositing conductive material in via hole 52. An illustrative arrangement for forming conductive via 42 using electrochemical deposition is shown in FIG. 8. Initially, via formation equipment 50 (e.g., laser 62 and etching tool 66 or other via formation tools) may form via hole 52 in glass layer 26. Seed layer deposition equipment 80 (e.g., physical vapor deposition equipment, atomic vapor deposition equipment or other chemical vapor deposition equipment, etc.) may be used to deposit a thin layer of metal (e.g., a metal coating layer) such as seed layer 82 on the walls of via hole 52. If desired, a polymer layer containing catalyst material may be deposited as a coating and exposed to laser light to form seed layer 82. Electrochemical deposition equipment 84 (e.g., electrolytic metal plating equipment and/or electroless plating equipment) may then be used to electroplate additional metal into via hole 52, thereby forming conductive via 42. Conductive material may completely fill via 42 or may coat the walls of via hole 52 sufficiently to create a conductive path through via 42.

Figure 9:
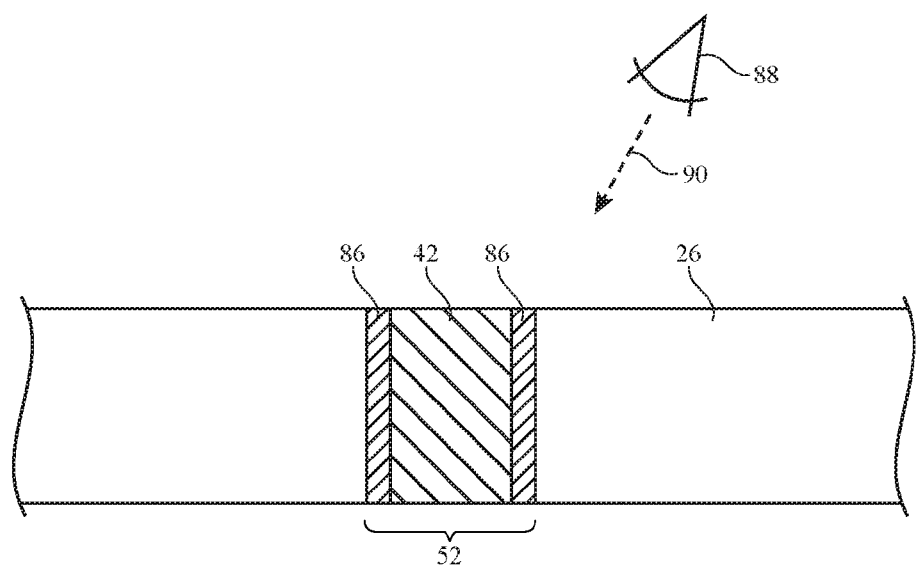
FIG. 9 is a cross-sectional side view of an illustrative via having a coating layer of material to enhance the appearance of the via in accordance with an embodiment.

If desired, the appearance of display 14 may be enhanced by depositing materials in the vias of layer 26 to help hide the vias from view. As shown in FIG. 9, for example, a layer of material such as coating layer 86 may be deposited on the walls of via hole 52 before depositing metal or conductive material into hole 52. Layer 86 may be a colored ink (e.g., white or black ink formed from metal oxide particles, carbon black particles, or other pigments or dyes in a polymer binder), or other opaque masking material that helps obscure the metal or other conductive material of conductive via 42 from view by a user (e.g., to block metal in via 42 from view by a user such as user 88 of FIG. 9 who is viewing via 42 in direction 90). Structures in device 10 that are overlapped by the border of display 14 such as housing 12 and/or the underside of layer 26 that is covered with an opaque masking material (e.g., black or white ink) may be characterized by a color. In this type of scenario, it may be desirable for the material of layer 86 (e.g., black or white ink) to be color matched to the material of the overlapped structures. Conductive vias 42 may also be hidden by using transparent conductive material in forming vias 42 that renders vias 42 transparent or nearly transparent. For example, indium tin oxide particles or other transparent conductive particles may be used in forming some or all of conductive vias 42 (e.g., to reduce the optical absorption that might otherwise be associated with using metal particles to form vias 42).

Figure 10:
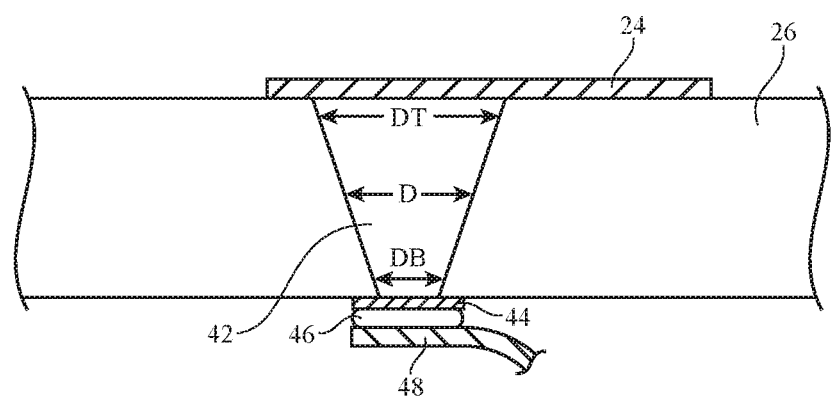
FIG. 10 is a cross-sectional side view of an illustrative via having a taper to help reduce contact resistance when coupling the via to a layer of material such as a layer of transparent conductive oxide in accordance with an embodiment.

To reduce contact resistance between via 42 and conductive structure 24, it may be desirable for the diameter of via 42 to be larger on the upper surface of glass layer 26 than on the lower surface of glass layer 26. As shown in FIG. 10, for example, via 42 may be provided with an average diameter of D. Near the bottom of via 42, the diameter of via 42 may be less than D (see, e.g., reduced diameter DB). Contact 44 may be formed from a relatively high conductivity material such as metal that allows a satisfactory ohmic contact to be formed between contact 44 and the conductive material in via 42 through the small contact area associated with reduced diameter DB. Near the top of via 42, the diameter of via 42 may be larger than D (see, e.g., enhanced diameter DT). The relatively large size of diameter DT enhances the surface area over which the metal in conductive via 42 contacts the conductive oxide or other conductive material of structure 24, thereby reducing the contact resistance associated with the connection between structure 24 and via 42.

Figure 11:
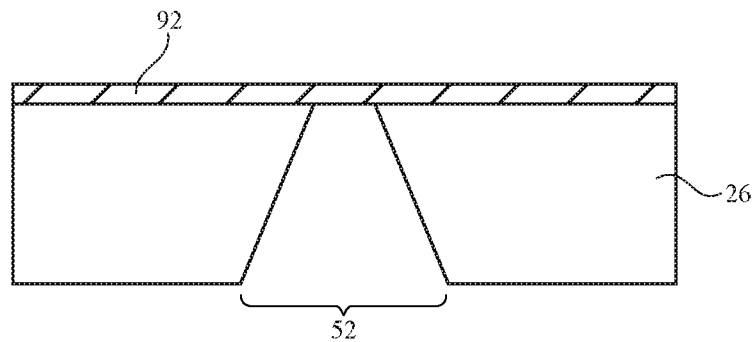
FIGS. 11, 12, and 13 are cross-sectional side views of a glass layer with a via showing how a removable film may be used to help control the filling of a via with conductive material in accordance with an embodiment.
Figure 12:
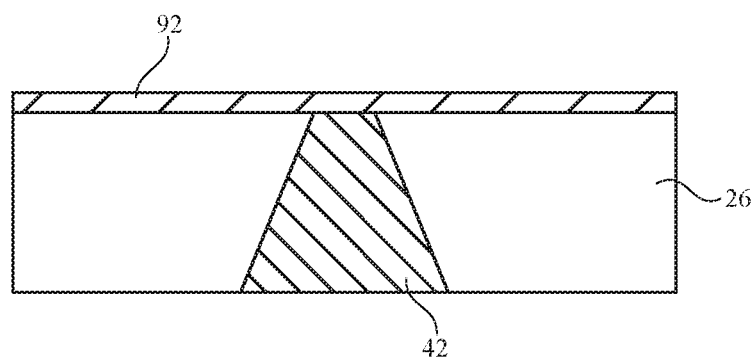
Figure 13:
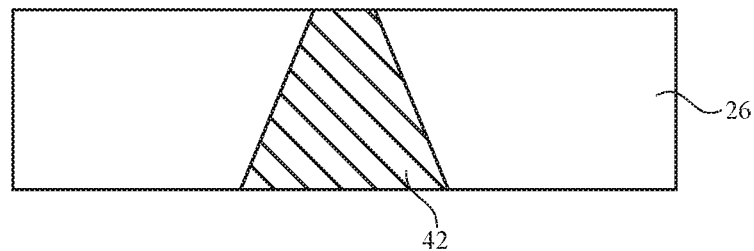

When depositing metal (e.g., when using physical vapor deposition or other deposition techniques to deposit material into the widened-diameter end of a tapered via hole), it may be desirable to temporarily cover an opposing end of via hole 52 with a material retention film such as retention film 92 of FIG. 11. Retention film 92 may be a flexible polymer layer such as a polymer sheet that is temporarily attached to the surface of glass layer 26. During deposition, metal or other conductive material fills via hole 52 to create conductive via 42. Due to the presence of retention film 92 (and, if desired, a carrier wafer or other carrier structure on film 92 that helps provide support, etc.), the deposited material does not pass through via hole 52, as shown in FIG. 12. Following formation of conductive via 42 by depositing material into via hole 52, film 92 (and the carrier) may be removed, as shown in FIG. 13. Layer 92 may be a temporary bonding layer that is releasable upon exposure to heat, ultraviolet light, etc.

Figure 14:
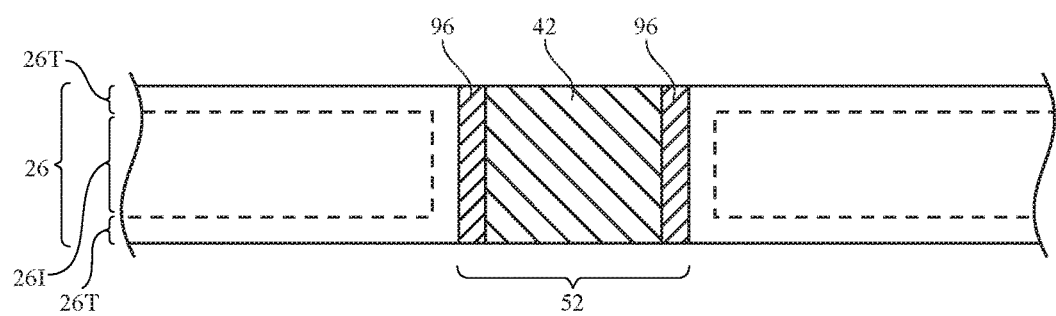
FIG. 14 is a cross-sectional side view of an illustrative via with a barrier layer to help reduce interactions between chemical strengthening materials in a glass layer and conductive materials such as metal in the via in accordance with an embodiment.

There may be a risk that potassium from the surface of a chemically strengthened glass layer may interact with copper or other metals in conductive via 42. For example, there may be a risk that potassium may diffuse into the copper or other conductive material, may migrating in via 42, and may migrate along the surfaces of one or more layers of material in via 42. A barrier layer may be formed in via hole 52 to help prevent this type of interaction. As shown in FIG. 14, chemically treated glass layer 26 may have a core of untreated glass material such as core 261 and an outer surface layer such as layer 26T that includes potassium that was introduced from the molten potassium salt bath during the ion exchange process. Barrier layer 96 may be deposited in via hole 52 before depositing metal or other conductive material to form conductive via 42. Barrier layer 96 may be formed from a material that blocks interaction between the potassium or other potentially reactive materials of layer 26T and the metal or other materials used in forming conductive via 42 and thereby prevents diffusion of potassium into the conductive material of via 42, migration of the potassium in via 42, migration of potassium along coating layer interfaces (e.g., inner or outer surfaces of barrier layer 96 and/or other coatings in via 42), etc. Barrier layer 96 may be formed from a coating layer such as a layer of silicon nitride, silicon oxynitride, magnesium doped silicon oxynitride, silicon boron nitride, or other inorganic or organic coating layer on the wall of via hole 52 or other barrier material.

Some metal deposition processes (e.g., certain chemical vapor deposition processes and electroplating processes) may involve elevated temperatures. For example, in electroplating processes it may be desirable to anneal electroplated metal that has been deposited. To avoid disruptions to layer 26T of glass layer 26 that might arise when a strengthened glass layer is exposed to elevated temperatures, it may be desirable to perform some or all of the metal deposition operations used in filling via hole 52 before chemical strengthening operations are performed on layer 26. This type of approach for forming vias 42 is shown in FIG. 15.

Figure 15:
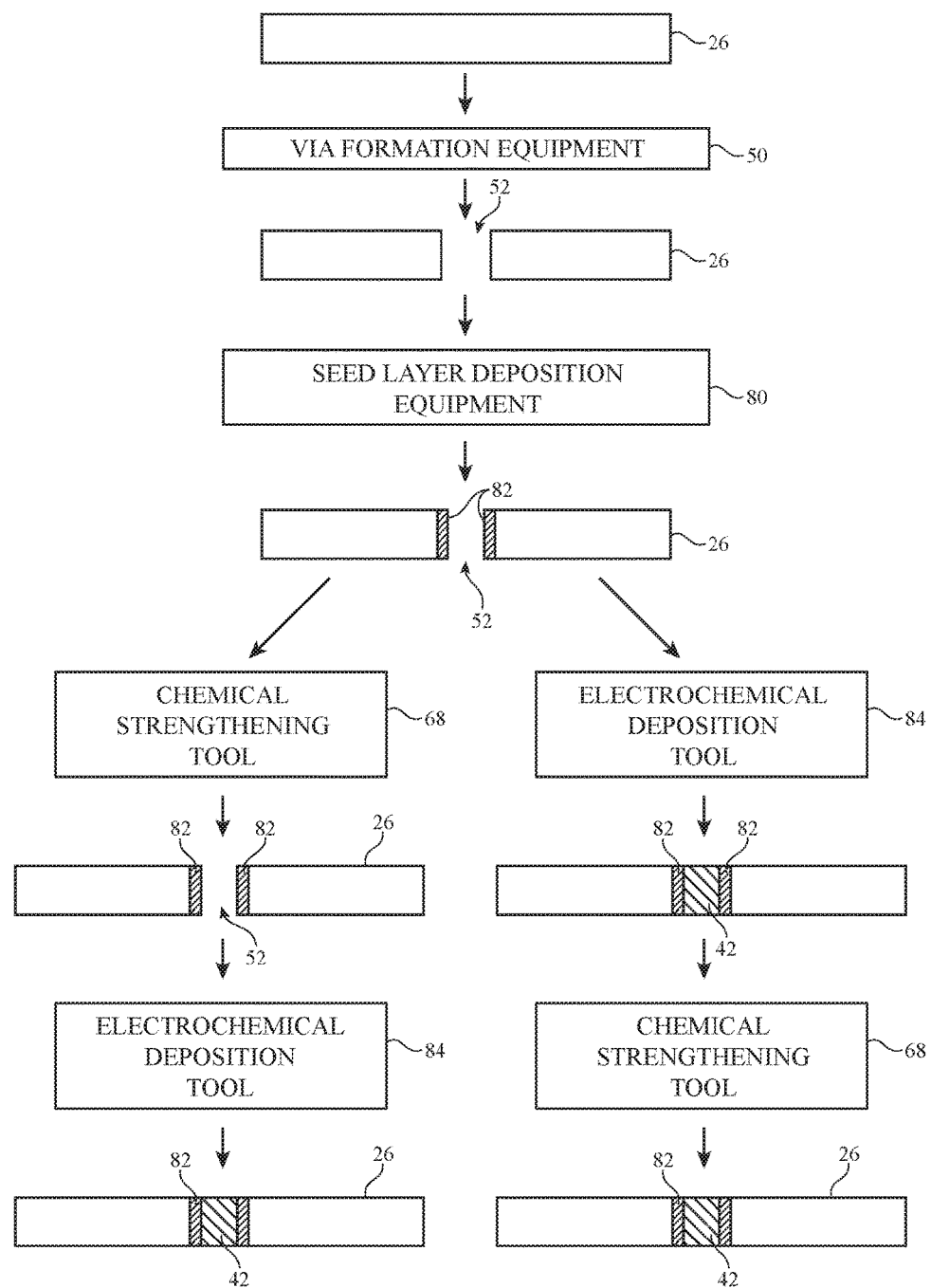
FIG. 15 is a diagram of illustrative equipment and operations involved in forming conductive vias in glass layers in accordance with an embodiment.

As shown in FIG. 15, via formation equipment 50 may be used to form via 52 in glass layer 26. Seed layer deposition equipment 80 may be used to deposit a seed layer such as seed layer 82 in via 52. Deposition equipment 80 may include equipment (e.g., atomic layer deposition equipment or other chemical vapor deposition equipment, etc.) that exposes glass layer 26 to elevated temperatures. Accordingly, it may be desirable to use equipment 80 before using chemical strengthening tool 68.

Following formation of layer 82, chemical strengthening tool 68 may strengthen glass layer 26 before electrochemical deposition tool 84 fills via hole 52 with additional metal to form via 42 (e.g., using a low temperature filling process) or electrochemical deposition tool 84 may fill via hole 52 (and anneal the metal in the filled hole) before chemical strengthening tool 68 is used to strengthen glass layer 26.

After vias 42 have been formed in glass layer 26, structures such as structures 24, layers 40, and contacts 44 of FIG. 4 may be formed on layer 26 and layer 26 may be assembled with other components to form device 10.

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
   a glass display layer having via holes;
   a coating layer inside the via holes;
   a structure that is overlapped by at least part of the glass display, wherein the coating layer is color matched to the structure; and
   conductive material in the via holes that forms conductive vias through the glass display layer.

2. The apparatus defined in claim 1 wherein the coating layer comprises an opaque coating layer.

3. The apparatus defined in claim 2 wherein the opaque coating layer comprises particles with a polymer binder.

4. The apparatus defined in claim 3 wherein the conductive material comprises metal, wherein the glass display layer comprises chemically strengthened glass and wherein the metal in the via holes comprises electroplated metal.

5. The apparatus defined in claim 1 wherein the coating layer comprises a dielectric barrier layer.

6. The apparatus defined in claim 5 wherein the glass display layer comprises chemically strengthened glass.

7. The apparatus defined in claim 6 wherein the chemically strengthened glass comprises potassium and wherein the coating layer prevents the potassium from diffusing into the conductive material, migrating in the via, and migrating along the opaque coating layer.

8. Apparatus, comprising:
   a glass display layer having via holes;
   a coating layer inside the via holes;
   conductive material in the via holes that forms conductive vias through the glass display layer; and
   transparent conductive oxide structures on the glass display layer, wherein each of the transparent conductive oxide structures is coupled to a respective one of the conductive vias.

9. The apparatus defined in claim 8 wherein the transparent conductive oxide structures are formed on a first surface of the glass display layer, the apparatus further comprising metal structures that are formed on an opposing second surface of the glass display layer and that are electrically coupled to the conductive vias.

10. The apparatus defined in claim 9 wherein the via holes are tapered.

11. The apparatus defined in claim 10 wherein the via holes have first diameters on the first surface and have second diameters that are smaller than the first diameters on the second surface and wherein the glass display layer comprises a chemically strengthened display cover glass layer.

12. Apparatus, comprising:
   a display cover glass layer having via holes;
   transparent conductive material in the via holes that forms conductive vias through the display cover glass layer; and
   at least one conductive structure on the display cover glass layer, wherein the at least one conductive structure is coupled to a respective one of the conductive vias.

13. The apparatus defined in claim 12 wherein the transparent conductive material comprises transparent conductive oxide.

14. The apparatus defined in claim 13 wherein the transparent conductive oxide comprises a material selected from the group consisting of indium tin oxide and zinc oxide.

15. The apparatus defined in claim 12 further comprising a coating layer in the via holes.

16. The apparatus defined in claim 15 wherein the coating layer comprises a colored ink.

17. The apparatus defined in claim 12 wherein the at least one conductive structure comprises a plurality of electrodes.

18. The apparatus defined in claim 17 wherein the plurality of electrodes comprise touch sensor electrodes.

19. The apparatus defined in claim 12 wherein the at least one conductive structure comprises transparent conductive oxide.

20. The apparatus defined in claim 12 wherein the display cover glass comprises first and second opposing surfaces, the via holes have a first diameter at the first surface, the via holes have a second diameter at the second surface, and the first diameter is greater than the second diameter.

* * * * *